(12) United States Patent
Inoue et al.

(10) Patent No.: US 12,273,026 B2
(45) Date of Patent: Apr. 8, 2025

(54) STEP-DOWN CONVERTER INCLUDING A STEP-DOWN TRANSFORMER AND A RESIN MOLDED BODY

(71) Applicant: Mitsubishi Electric Corporation, Tokyo (JP)

(72) Inventors: Hirofumi Inoue, Tokyo (JP); Kosuke Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 256 days.

(21) Appl. No.: 17/556,394

(22) Filed: Dec. 20, 2021

(65) Prior Publication Data

US 2022/0311332 A1   Sep. 29, 2022

(30) Foreign Application Priority Data

Mar. 26, 2021   (JP) .................................. 2021-053467

(51) Int. Cl.
*H02M 3/00*       (2006.01)
*H02M 3/335*     (2006.01)
(Continued)

(52) U.S. Cl.
CPC ....... *H02M 3/003* (2021.05); *H02M 3/33569* (2013.01); *H02M 3/33573* (2021.05); *H05K 7/14329* (2022.08); *H05K 7/209* (2013.01)

(58) Field of Classification Search
CPC ............. H02M 3/003; H02M 3/33569; H02M 3/33573; H02M 3/3353; H05K 7/209; H05K 7/20854
See application file for complete search history.

(56) References Cited

U.S. PATENT DOCUMENTS

| | | | |
|---|---|---|---|
| 9,530,707 B2 * | 12/2016 | Harada | ............... H01L 23/3675 |
| 2009/0294950 A1 * | 12/2009 | Itou | ....................... H01L 21/568 |
| | | | 257/E23.141 |

(Continued)

FOREIGN PATENT DOCUMENTS

| | | |
|---|---|---|
| JP | 53-152161 U | 11/1978 |
| JP | 9-7844 A | 1/1997 |

(Continued)

OTHER PUBLICATIONS

Notice of Reasons for Refusal dated Jan. 25, 2022 from the Japanese Patent Office in JP Application No. 2021-053467.

*Primary Examiner* — Zachary Pape
(74) *Attorney, Agent, or Firm* — Sughrue Mion, PLLC

(57) ABSTRACT

Provided is a step-down converter including: a step-down transformer including a primary-side coil and a secondary-side coil; a resin molded body integrally molded through use of a non-conductive resin together with the primary-side coil and the secondary-side coil; and a rectifier element, wherein the resin molded body has a mounting surface on which the rectifier element is to be mounted, wherein the secondary-side coil includes a first plate-shaped terminal, wherein the first plate-shaped terminal is exposed from the resin molded body in the mounting surface, wherein, on the mounting surface, a second plate-shaped terminal is provided in parallel to the first plate-shaped terminal across a gap, wherein the rectifier element is bonded to both of the first plate-shaped terminal and the second plate-shaped terminal by soldering, and wherein the non-conductive resin has a melting point higher than a melting point of the solder.

5 Claims, 5 Drawing Sheets

(51) Int. Cl.
*H05K 7/14* (2006.01)
*H05K 7/20* (2006.01)

(56) References Cited

U.S. PATENT DOCUMENTS

| | | | |
|---|---|---|---|
| 2016/0305466 A1* | 10/2016 | Kawashima | F16B 43/001 |
| 2019/0369143 A1* | 12/2019 | Kawaguchi | H01R 11/287 |
| 2020/0021201 A1* | 1/2020 | Sakata | H02M 7/06 |
| 2020/0303362 A1* | 9/2020 | Hoya | H01L 23/5385 |
| 2021/0384834 A1 | 12/2021 | Sugaya et al. | |

FOREIGN PATENT DOCUMENTS

| | | |
|---|---|---|
| JP | 11-288824 A | 10/1999 |
| JP | 2007-221919 A | 8/2007 |
| JP | 2015-159175 A | 9/2015 |
| JP | 2020-10480 A | 1/2020 |
| WO | 2020/136886 A1 | 7/2020 |

* cited by examiner

STEP-DOWN CONVERTER INCLUDING A STEP-DOWN TRANSFORMER AND A RESIN MOLDED BODY

BACKGROUND OF THE INVENTION

Field of the Invention

This disclosure relates to a step-down converter including a step-down transformer and a resin molded body integrally molded together with the step-down transformer.

Description of the Related Art

In a plug-in hybrid vehicle, an electric vehicle, or other electrically powered vehicles, a step-down converter is used to step down a voltage of a high-voltage battery to a low voltage in a 12-volt system. In Patent Literature 1, there is described an in-vehicle DC/DC converter including an AC/DC conversion module board. The AC/DC conversion module board includes a transformer including a primary-side coil and a secondary-side coil, rectifier elements of a surface mount type, and a metal substrate on which the transformer and the rectifier elements are mounted. On the metal substrate, a plurality of conductor patterns insulated from the metal substrate through intermediation of an insulating layer are formed. An end portion of the secondary-side coil and the rectifier elements are each soldered to any of the plurality of conductor patterns. The metal substrate is screwed onto a base plate for heat radiation.

CITATION LIST

Patent Literature

[PTL 1] JP 2007-221919 A

In the in-vehicle DC/DC converter described above, it is conceivable to integrate the primary-side coil and the secondary-side coil with a resin molded body molded through use of a non-conductive resin, to thereby reduce the number of assembly steps. However, in general, the non-conductive resin has a melting point lower than a melting point of solder. Accordingly, in a step of mounting the rectifier elements of the surface mount type, normally, the primary-side coil and the secondary-side coil integrated with the resin molded body cannot be put into a furnace. As a result, in the in-vehicle DC/DC converter of Patent Literature 1, even when the primary-side coil and the secondary-side coil are integrated with the resin molded body, a metal substrate for mounting the rectifier elements by reflow soldering is required. Thus, the in-vehicle DC/DC converter of Patent Literature 1 has a problem in that it is difficult to reduce the number of components.

SUMMARY OF THE INVENTION

This disclosure has been made to solve the above-mentioned problem, and has an object to provide a step-down converter with which the number of components can be reduced.

According to at least one embodiment of this disclosure, there is provided a step-down converter including: a step-down transformer including a primary-side coil and a secondary-side coil; a resin molded body integrally molded through use of a non-conductive resin together with the primary-side coil and the secondary-side coil; and a rectifier element configured to rectify an induced voltage of the secondary-side coil, wherein the rectifier element is a rectifier element of a surface mount type, wherein the resin molded body has a mounting surface on which the rectifier element is to be mounted, wherein the secondary-side coil includes a first plate-shaped terminal, wherein the first plate-shaped terminal is exposed from the resin molded body in the mounting surface, wherein, on the mounting surface, a second plate-shaped terminal is provided in parallel to the first plate-shaped terminal across a gap, wherein the rectifier element is bonded to both of the first plate-shaped terminal and the second plate-shaped terminal by soldering using solder, and wherein the non-conductive resin has a melting point higher than a melting point of the solder.

According to at least one embodiment of this disclosure, the number of components of the step-down converter can be reduced.

DESCRIPTION OF THE EMBODIMENTS

First Embodiment

Figure 1:
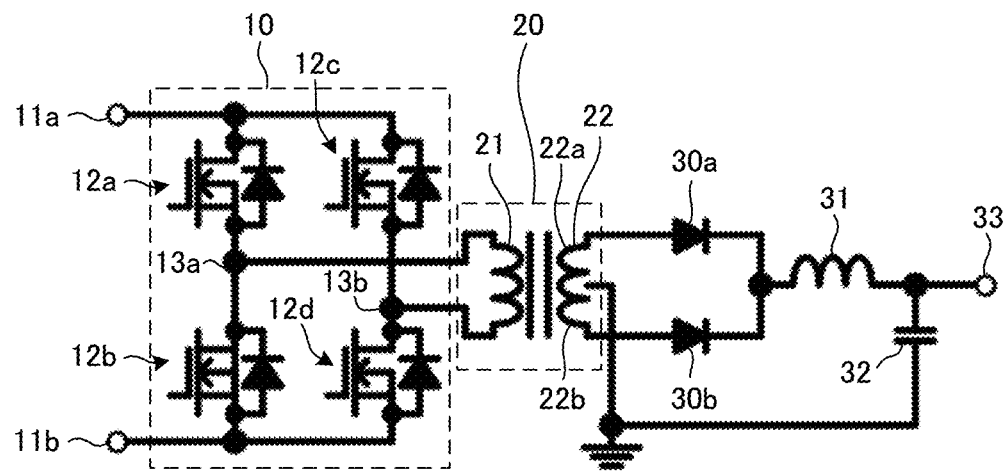
FIG. 1 is a circuit diagram for illustrating a circuit configuration of a step-down converter according to a first embodiment of this disclosure.

A step-down converter according to a first embodiment of this disclosure is described. FIG. 1 is a circuit diagram for illustrating a circuit configuration of the step-down converter according to the first embodiment. As illustrated in FIG. 1, the step-down converter includes a switching circuit unit 10, a step-down transformer 20, and a plurality of rectifier elements 30a and 30b.

The switching circuit unit 10 is connected to a positive terminal 11a and a negative terminal 11b. The positive terminal 11a is connected to a positive electrode of a high-voltage battery. The negative terminal 11b is connected to a negative electrode of the high-voltage battery. The switching circuit unit 10 includes four switching elements 12a, 12b, 12c, and 12d. Each of the switching elements 12a, 12b, 12c, and 12d is controlled by a control circuit (not shown).

The switching element 12a and the switching element 12b are connected in series to each other between the positive terminal 11a and the negative terminal 11b. The switching element 12c and the switching element 12d are connected in series to each other between the positive terminal 11a and the negative terminal 11b. The switching element 12a and the switching element 12b, and the switching element 12c and the switching element 12d are connected in parallel to each other.

The step-down transformer 20 includes a primary-side coil 21 and a secondary-side coil 22. One end of the primary-side coil 21 is connected to a node 13a between the switching element 12a and the switching element 12b. The other end of the primary-side coil 21 is connected to a node 13b between the switching element 12c and the switching element 12d.

The secondary-side coil 22 includes a first coil 22a and a second coil 22b. One end of the first coil 22a is connected to an anode of the rectifier element 30a. One end of the second coil 22b is connected to an anode of the rectifier element 30b. The other end of the first coil 22a and the other end of the second coil 22b are maintained at a reference potential.

Each of the rectifier element 30a and the rectifier element 30b is an element configured to rectify an induced voltage of the secondary-side coil 22. The rectifier element 30a includes, as described later, two rectifier elements 30a1 and 30a2 (not shown in FIG. 1) connected in parallel to each other. Similarly, the rectifier element 30b includes, as described later, two rectifier elements 30b1 and 30b2 (not shown in FIG. 1) connected in parallel to each other.

A cathode of the rectifier element 30a and a cathode of the rectifier element 30b are connected to one end of a smoothing reactor 31. The other end of the smoothing reactor 31 is connected to an output terminal 33, and is also connected to one electrode of a smoothing capacitor 32. The other electrode of the smoothing capacitor 32 is maintained at the reference potential.

Figure 2:
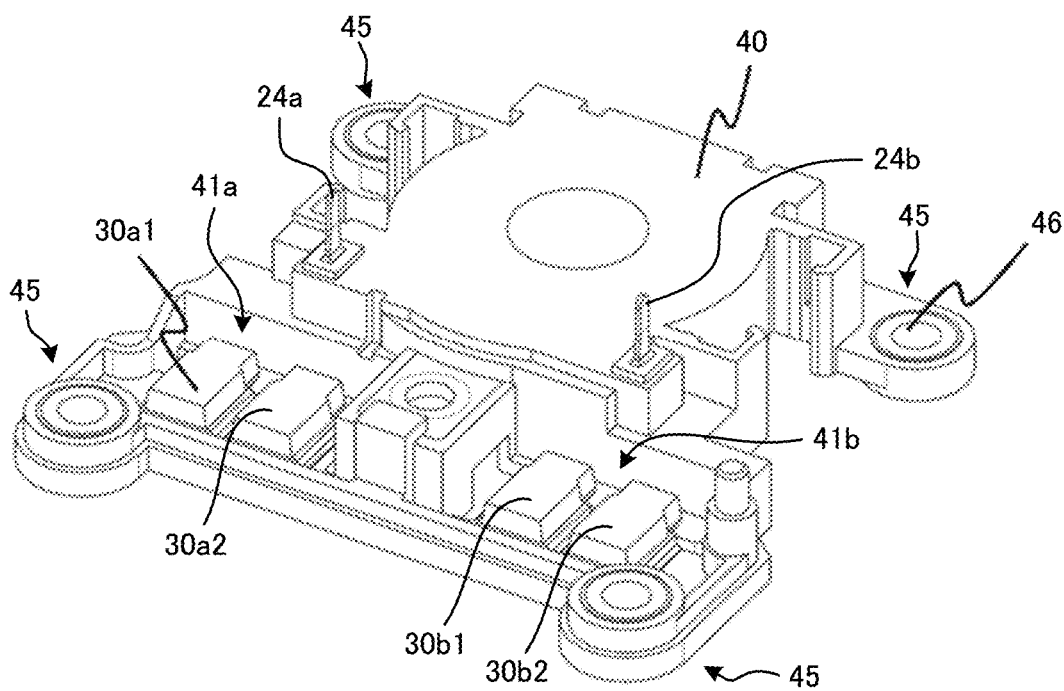
FIG. 2 is a perspective view for illustrating a configuration of a main part of the step-down converter according to the first embodiment.
Figure 3:
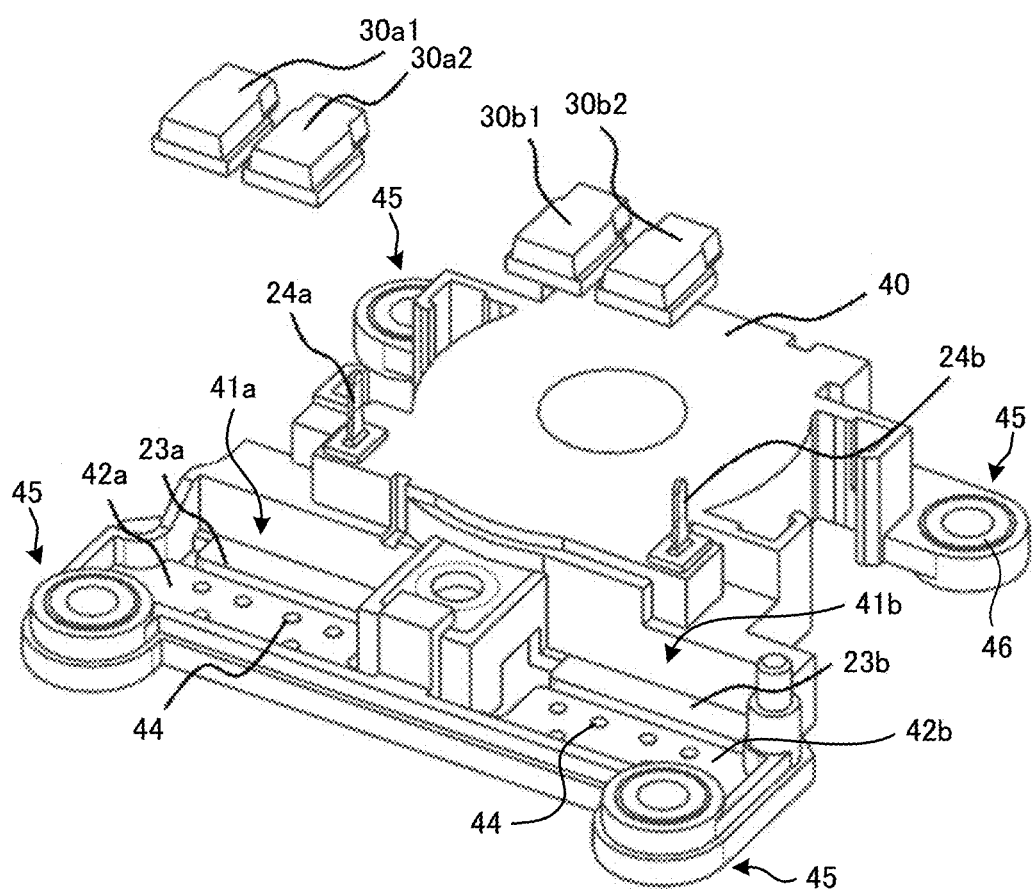
FIG. 3 is an exploded perspective view for illustrating the configuration of the main part of the step-down converter according to the first embodiment.
Figure 4:
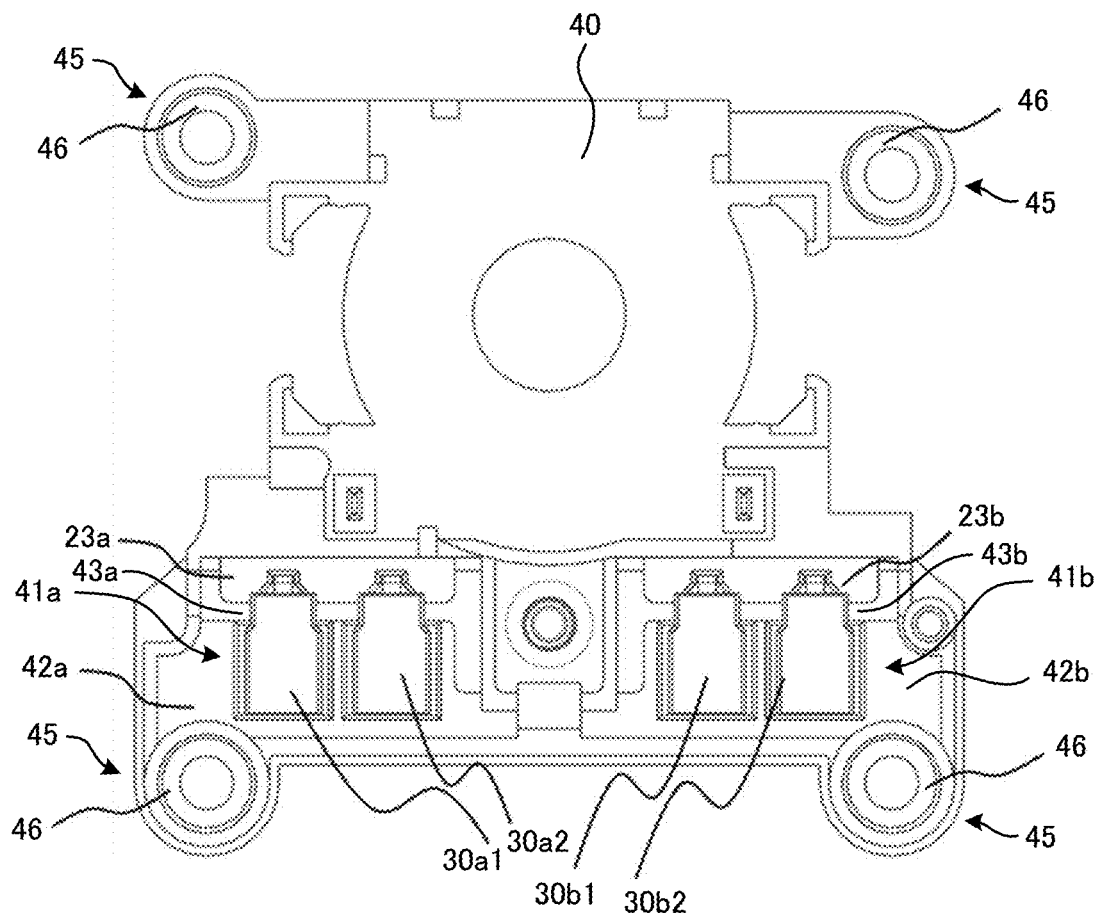
FIG. 4 is a top view for illustrating the configuration of the main part of the step-down converter according to the first embodiment.
Figure 5:
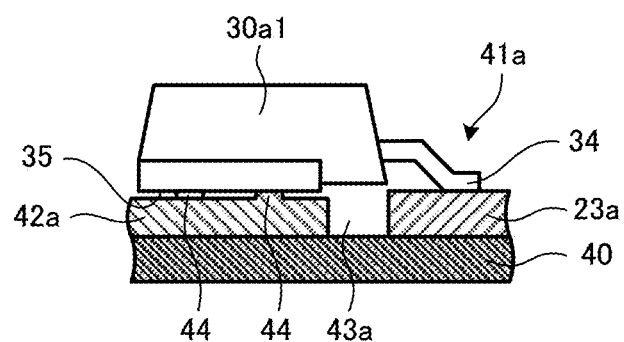
FIG. 5 is a sectional view for illustrating a configuration of a mounting surface of a resin molded body in the step-down converter according to the first embodiment.

Next, a physical configuration of the step-down converter according to the first embodiment is described. FIG. 2 is a perspective view for illustrating a configuration of a main part of the step-down converter according to the first embodiment. FIG. 3 is an exploded perspective view for illustrating the configuration of the main part of the step-down converter according to the first embodiment. FIG. 4 is a top view for illustrating the configuration of the main part of the step-down converter according to the first embodiment. FIG. 2 to FIG. 4 mainly show, in the circuit configuration of the step-down converter illustrated in FIG. 1, the primary-side coil 21 and the secondary-side coil 22 of the step-down transformer 20, and the rectifier elements 30a1, 30a2, 30b1, and 30b2. FIG. 5 is a sectional view for illustrating a configuration of a mounting surface of a resin molded body in the step-down converter according to the first embodiment. In FIG. 5, illustration of a solidified solder layer is omitted.

As illustrated in FIG. 2 to FIG. 5, the step-down converter includes a resin molded body 40 and the rectifier elements 30a1, 30a2, 30b1, and 30b2. The resin molded body 40 is formed to cover the primary-side coil 21 and the secondary-side coil 22 of the step-down transformer 20. The primary-side coil 21 and the secondary-side coil 22 of the step-down transformer 20 are covered with the resin molded body 40 except for parts on which the rectifier elements 30a1, 30a2, 30b1, and 30b2 are to be mounted. In order to increase the conversion efficiency of the step-down converter, it is preferred that both of the material of the primary-side coil 21 and the material of the secondary-side coil 22 be copper.

The resin molded body 40 is integrally molded through use of a non-conductive resin together with the primary-side coil 21 and the secondary-side coil 22 of the step-down transformer 20. Further, the resin molded body 40 is also integrally molded with a second plate-shaped terminal 42a, a second plate-shaped terminal 42b, and a plurality of collar portions 46, which are all described later. That is, the primary-side coil 21, the secondary-side coil 22, the second plate-shaped terminal 42a, the second plate-shaped terminal 42b, and the plurality of collar portions 46 are insert components to be inserted into a mold when the resin molded body 40 is molded.

A terminal 24a on the one end side of the primary-side coil 21 projects from a part of the resin molded body 40. A terminal 24b on the other end side of the primary-side coil 21 projects from another part of the resin molded body 40. Both of the terminal 24a and the terminal 24b are connected to the switching circuit unit 10 illustrated in FIG. 1.

The resin molded body 40 has a mounting surface 41a and a mounting surface 41b. The rectifier element 30a1 and the rectifier element 30a2 are mounted on the mounting surface 41a. The rectifier element 30b1 and the rectifier element 30b2 are mounted on the mounting surface 41b. Each of the rectifier elements 30a1, 30a2, 30b1, and 30b2 is a rectifier element of a surface mount type.

The secondary-side coil 22 includes a first plate-shaped terminal 23a serving as a terminal on the one end side of the first coil 22a, and a first plate-shaped terminal 23b serving as a terminal on the one end side of the second coil 22b. The first plate-shaped terminal 23a is exposed from the resin molded body 40 in the mounting surface 41a of the resin molded body 40. The first plate-shaped terminal 23a is formed into a flat plate shape along the mounting surface 41a. The first plate-shaped terminal 23b is exposed from the resin molded body 40 in the mounting surface 41b of the resin molded body 40. The first plate-shaped terminal 23b is formed into a flat plate shape along the mounting surface 41b.

The second plate-shaped terminal 42a is provided on the mounting surface 41a. The second plate-shaped terminal 42a is formed into a flat plate shape along the mounting surface 41a. The second plate-shaped terminal 42a is arranged in parallel to the first plate-shaped terminal 23a across a gap 43a. The second plate-shaped terminal 42b is formed on the mounting surface 41b. The second plate-shaped terminal 42b is formed into a flat plate shape along the mounting surface 41b. The second plate-shaped terminal 42b is arranged in parallel to the first plate-shaped terminal 23b across a gap 43b. Both of the second plate-shaped terminal 42a and the second plate-shaped terminal 42b are electrically connected to the one end of the smoothing reactor 31 illustrated in FIG. 1.

The second plate-shaped terminal 42a includes a plurality of protruding portions 44. In the first embodiment, in the second plate-shaped terminal 42a, three protruding portions 44 are formed on a bonding surface to be bonded to the rectifier element 30a1, and three protruding portions 44 are also formed on a bonding surface to be bonded to the rectifier element 30a2. Each of the protruding portions 44 projects from a surface of the second plate-shaped terminal 42a along a direction normal to the surface. Each of the protruding portions 44 has conductivity. The second plate-shaped terminal 42a is bonded to the rectifier element 30a1 and the rectifier element 30a2 at least at the protruding portions 44.

Similarly, the second plate-shaped terminal 42*b* includes a plurality of protruding portions 44. In the first embodiment, in the second plate-shaped terminal 42*b*, three protruding portions 44 are formed on a bonding surface to be bonded to the rectifier element 30*b*1, and three protruding portions 44 are also formed on a bonding surface to be bonded to the rectifier element 30*b*2. The second plate-shaped terminal 42*b* is bonded to the rectifier element 30*b*1 and the rectifier element 30*b*2 at least at the protruding portions 44.

The protruding portions 44 are formed in each of the second plate-shaped terminal 42*a* and the second plate-shaped terminal 42*b*. Thus, when solder melts in a reflow step, surplus solder can be accumulated on a flat surface other than the protruding portions 44 in each of the second plate-shaped terminal 42*a* and the second plate-shaped terminal 42*b*. Accordingly, an increase in thickness of the solidified solder layer can be suppressed.

In the first embodiment, the protruding portions 44 are formed in each of the second plate-shaped terminal 42*a* and the second plate-shaped terminal 42*b*, but the protruding portions may be formed in each of the first plate-shaped terminal 23*a* and the first plate-shaped terminal 23*b*.

The rectifier element 30*a*1 and the rectifier element 30*a*2 are mounted on the mounting surface 41*a*. The rectifier element 30*a*1 is bonded to both of the first plate-shaped terminal 23*a* and the second plate-shaped terminal 42*a* across the gap 43*a* by soldering using solder. An anode terminal 34 of the rectifier element 30*a*1 is bonded to the first plate-shaped terminal 23*a* by soldering. A cathode terminal 35 of the rectifier element 30*a*1 is bonded to the second plate-shaped terminal 42*a* by soldering. Similarly, the rectifier element 30*a*2 is bonded to both of the first plate-shaped terminal 23*a* and the second plate-shaped terminal 42*a* across the gap 43*a* by soldering using solder.

The rectifier element 30*b*1 and the rectifier element 30*b*2 are mounted on the mounting surface 41*b*. Similarly to the rectifier element 30*a*1 and the rectifier element 30*a*2, each of the rectifier element 30*b*1 and the rectifier element 30*b*2 is bonded to both of the first plate-shaped terminal 23*b* and the second plate-shaped terminal 42*b* across the gap 43*b* by soldering using solder.

As the non-conductive resin being a material for forming the resin molded body 40, a resin having a melting point higher than a melting point of solder is used. As the resin having a melting point higher than the melting point of solder, there is given polyphenylene sulfide (PPS), liquid crystal polymer (LCP), or the like. For example, while lead-free solder has a melting point of about 220° C., PPS has a melting point of about 280° C., and LCP has a melting point of from about 280° C. to about 370° C.

In this manner, in a step of mounting the rectifier elements 30*a*1, 30*a*2, 30*b*1, and 30*b*2, the resin molded body 40 can be put into a furnace together with the rectifier elements 30*a*1, 30*a*2, 30*b*1, and 30*b*2. As a result, reflow soldering can be performed without separately using a metal substrate or the like for mounting the rectifier elements.

The first plate-shaped terminal 23*a* and the second plate-shaped terminal 42*a* may be subjected to plating of Ni, Au, Ti, or the like in advance. In this manner, a bonding strength by the soldering can be increased. When the first plate-shaped terminal 23*a* and the second plate-shaped terminal 42*a* are made of pre-plated materials, it is preferred to select plating that can withstand a molding temperature of the resin molded body 40.

It is preferred that a thermal expansion coefficient of the material for forming the primary-side coil 21 and the secondary-side coil 22 be equivalent to a thermal expansion coefficient of the non-conductive resin. When those thermal expansion coefficients are equivalent to each other, even in a case in which the temperatures of the primary-side coil 21 and the secondary-side coil 22 rise, peeling or cracking of the resin molded body 40 can be prevented from occurring.

Figure 6:
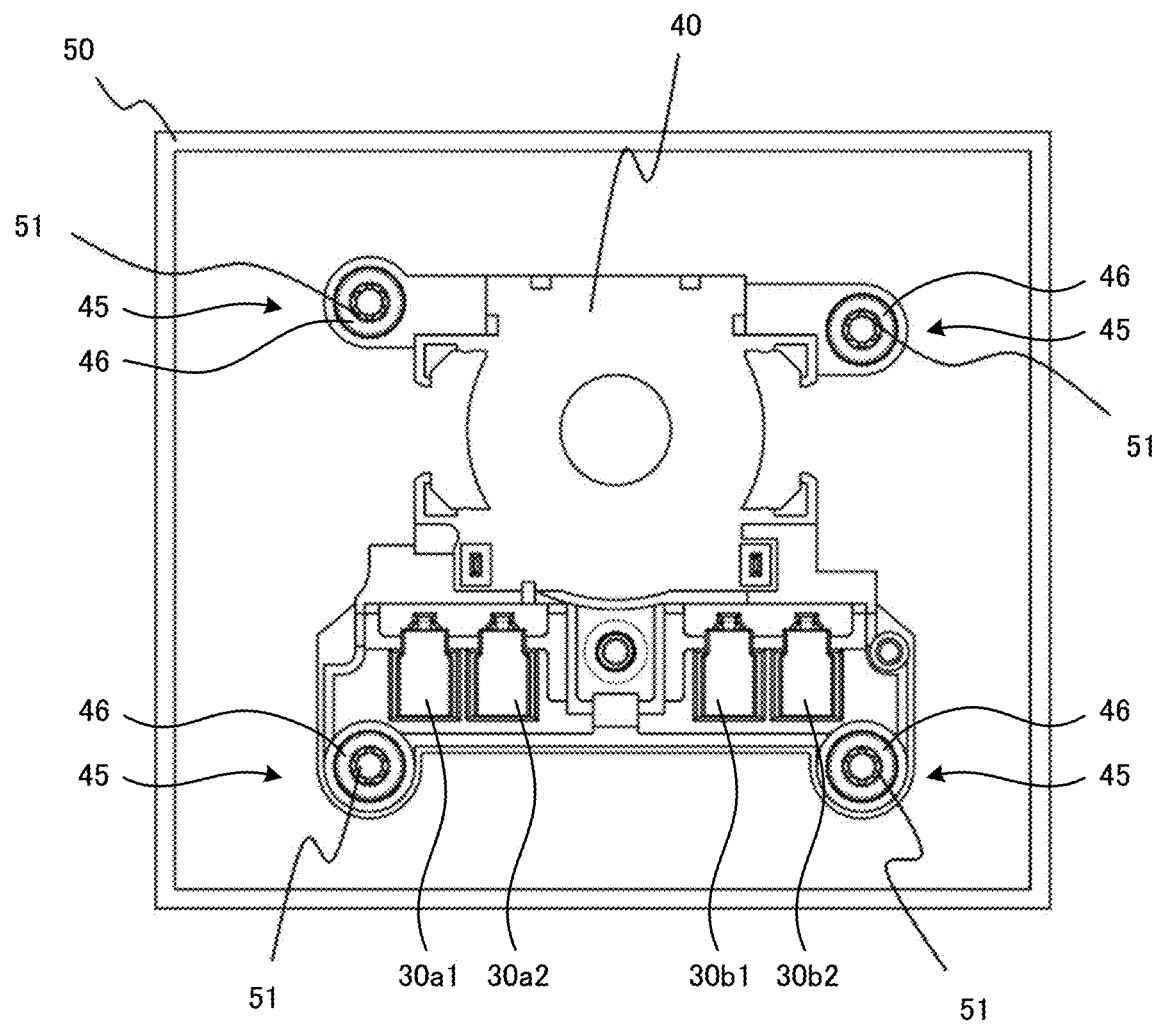
FIG. 6 is a top view for illustrating a configuration of the step-down converter according to the first embodiment.

FIG. 6 is a top view for illustrating a configuration of the step-down converter according to the first embodiment. FIG. 6 shows, in addition to the configuration illustrated in FIG. 4, a casing 50 included in the step-down converter. A plurality of fixing portions 45 are formed on the resin molded body 40. The plurality of fixing portions 45 are provided in order to fix the resin molded body 40 to the casing 50 for accommodating the resin molded body 40. The metal tubular collar portions 46 are formed in the respective fixing portions 45. The collar portions 46 are formed integrally with the resin molded body 40.

The resin molded body 40 is fixed to the casing 50 by screws 51 inserted into the respective collar portions 46. In this manner, vibration resistance of the step-down converter can be improved, and hence, even when the step-down converter is installed on an automobile, the step-down converter can withstand vibrations of the automobile.

The casing 50 also functions as a heat radiation member configured to radiate heat to the outside of the step-down converter. Under a state in which the resin molded body 40 is fixed to the casing 50, a bottom portion of the resin molded body 40 is opposed to the casing 50. A heat transfer member (not shown) is provided between the bottom portion of the resin molded body 40 and the casing 50. In this manner, the resin molded body 40 and the casing 50 are thermally connected to each other through intermediation of the heat transfer member. Heat generated in the primary-side coil 21 and the secondary-side coil 22 transfers to the casing 50 via the resin molded body 40 and the heat transfer member, and is efficiently radiated from the casing 50 to the outside of the step-down converter.

In the first embodiment, the rectifier elements 30*a*1, 30*a*2, 30*b*1, and 30*b*2 having large heat generation amounts are directly bonded to the first plate-shaped terminal 23*a* or the first plate-shaped terminal 23*b* of the secondary-side coil 22. Accordingly, heat generated in the rectifier elements 30*a*1, 30*a*2, 30*b*1, and 30*b*2 transfers to the casing 50 via the secondary-side coil 22, the resin molded body 40, and the heat transfer member, and is radiated from the casing 50 to the outside of the step-down converter. As described above, heat radiation paths of the rectifier elements 30*a*1, 30*a*2, 30*b*1, and 30*b*2 are common to a heat radiation path of the secondary-side coil 22.

Cooling fins or the like may be provided on a heat radiation surface of the casing 50. When the cooling fins are provided on the heat radiation surface of the casing 50, the heat radiation efficiency from the casing 50 to the outside is improved. A method of cooling the casing 50 is not limited to water cooling, and may be air cooling.

As described above, the step-down converter according to the first embodiment includes the step-down transformer 20, the resin molded body 40, and the rectifier elements 30*a*1, 30*a*2, 30*b*1, and 30*b*2. The step-down transformer 20 includes the primary-side coil 21 and the secondary-side coil 22. The resin molded body 40 is integrally molded through use of the non-conductive resin together with the primary-side coil 21 and secondary-side coil 22. Each of the rectifier elements 30*a*1, 30*a*2, 30*b*1, and 30*b*2 is configured to rectify the induced voltage of the secondary-side coil 22. Each of the rectifier elements 30*a*1, 30*a*2, 30*b*1, and 30*b*2 is a rectifier element of a surface mount type. The resin molded body 40 has the mounting surface 41a on which the rectifier elements 30a1 and 30a2 are to be mounted, and the mounting surface 41b on which the rectifier elements 30b1 and 30b2 are to be mounted. The secondary-side coil 22 includes the first plate-shaped terminals 23a and 23b. The first plate-shaped terminal 23a is exposed from the resin molded body 40 in the mounting surface 41a. The first plate-shaped terminal 23b is exposed from the resin molded body 40 in the mounting surface 41b. On the mounting surface 41a, the second plate-shaped terminal 42a is provided in parallel to the first plate-shaped terminal 23a across the gap 43a. On the mounting surface 41b, the second plate-shaped terminal 42b is provided in parallel to the first plate-shaped terminal 23b across the gap 43b. Each of the rectifier elements 30a1 and 30a2 is bonded to both of the first plate-shaped terminal 23a and the second plate-shaped terminal 42a by soldering using solder. Each of the rectifier elements 30b1 and 30b2 is bonded to both of the first plate-shaped terminal 23b and the second plate-shaped terminal 42b by soldering using solder. The above-mentioned non-conductive resin has a melting point higher than a melting point of the solder.

With this configuration, the rectifier elements 30a1 and 30a2 can be mounted on the mounting surface 41a of the resin molded body 40, and the rectifier elements 30b1 and 30b2 can be mounted on the mounting surface 41b of the resin molded body 40. Further, in the step of mounting the rectifier elements 30a1, 30a2, 30b1, and 30b2, the resin molded body 40 can be put into a furnace together with the rectifier elements 30a1, 30a2, 30b1, and 30b2. In this manner, the rectifier elements 30a1, 30a2, 30b1, and 30b2 can be mounted by reflow soldering even without using a metal substrate for mounting the rectifier elements 30a1, 30a2, 30b1, and 30b2. Accordingly, the metal substrate described in Patent Literature 1 can be omitted, and hence the number of components of the step-down converter can be reduced.

In the step-down converter according to the first embodiment, each of the second plate-shaped terminals 42a and 42b includes the protruding portions 44 bonded to the rectifier element. With this configuration, in each of the second plate-shaped terminals 42a and 42b, surplus solder can be accumulated in a part other than the protruding portions 44. As a result, the increase in thickness of the solidified solder layer can be suppressed. Each of the first plate-shaped terminals 23a and 23b may include the protruding portions 44.

The step-down converter according to the first embodiment further includes the casing 50 for accommodating the resin molded body 40. The metal tubular collar portions 46 are formed on the resin molded body 40. The resin molded body 40 is fixed to the casing 50 by the screws 51 inserted into the respective collar portions 46. With this configuration, the vibration resistance of the step-down converter can be improved.

In the step-down converter according to the first embodiment, the heat transfer member is provided between the resin molded body 40 and the casing 50. With this configuration, the heat generated in the primary-side coil 21 and the secondary-side coil 22 can be efficiently radiated to the outside via the resin molded body 40, the heat transfer member, and the casing 50.

Second Embodiment

Figure 7:
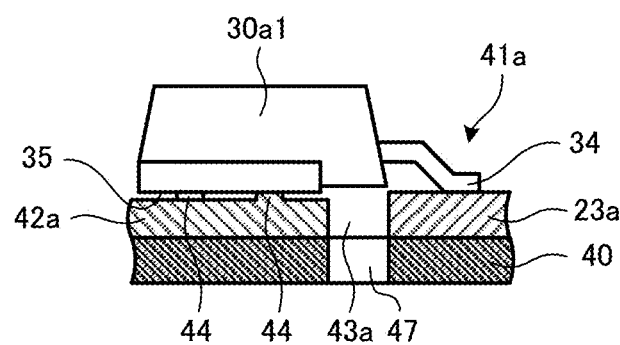
FIG. 7 is a sectional view for illustrating a configuration of a mounting surface of a resin molded body in a step-down converter according to a second embodiment of this disclosure.

A step-down converter according to a second embodiment of this disclosure is described. FIG. 7 is a sectional view for illustrating a configuration of a mounting surface of a resin molded body in the step-down converter according to the second embodiment. Components having the same functions and actions as those of the first embodiment are denoted by the same reference symbols, and description thereof is omitted.

In a case in which an unpredictable large current is generated, and thus the rectifier element is damaged to be brought into a short-circuit state, an exterior material of the rectifier element may burn. In this case, the current continuously flows, and hence the burning may be continued until combustible components of both of the rectifier element and the resin molded body are gone. The resin molded body is formed through use of a flame-retardant material, but is not always incombustible. Accordingly, when the resin molded body burns to be carbonized between the first plate-shaped terminal and the second plate-shaped terminal, conduction may be established between the first plate-shaped terminal and the second plate-shaped terminal via the carbonized resin molded body.

As illustrated in FIG. 7, in the resin molded body 40 in the second embodiment, a cavity portion 47 is formed in the mounting surface 41a positioned between the first plate-shaped terminal 23a and the second plate-shaped terminal 42a. The cavity portion 47 passes through the resin molded body 40 in a thickness direction of the resin molded body 40. It is preferred that the cavity portion 47 be formed in the entire part sandwiched between the first plate-shaped terminal 23a and the second plate-shaped terminal 42a in plan view of the mounting surface 41a. Although not shown, the cavity portion 47 is similarly formed also in the mounting surface 41b positioned between the first plate-shaped terminal 23b and the second plate-shaped terminal 42b. When the strength of the resin molded body 40 is decreased due to the formation of the cavity portion 47, the cavity portion 47 may be filled with a resin having a higher flame retardancy than that of the material for forming the resin molded body 40.

As described above, in the step-down converter according to the second embodiment, the cavity portion 47 is formed in the mounting surface 41a positioned between the first plate-shaped terminal 23a and the second plate-shaped terminal 42a. Similarly, the cavity portion 47 is formed in the mounting surface 41b positioned between the first plate-shaped terminal 23b and the second plate-shaped terminal 42b.

With this configuration, even when the exterior material of the rectifier element 30a1 or the rectifier element 30a2 burns, conduction between the first plate-shaped terminal 23a and the second plate-shaped terminal 42a due to the carbonized resin molded body 40 can be prevented. Similarly, even when the exterior material of the rectifier element 30b1 or the rectifier element 30b2 burns, conduction between the first plate-shaped terminal 23b and the second plate-shaped terminal 42b due to the carbonized resin molded body 40 can be prevented.

Third Embodiment

Figure 8:
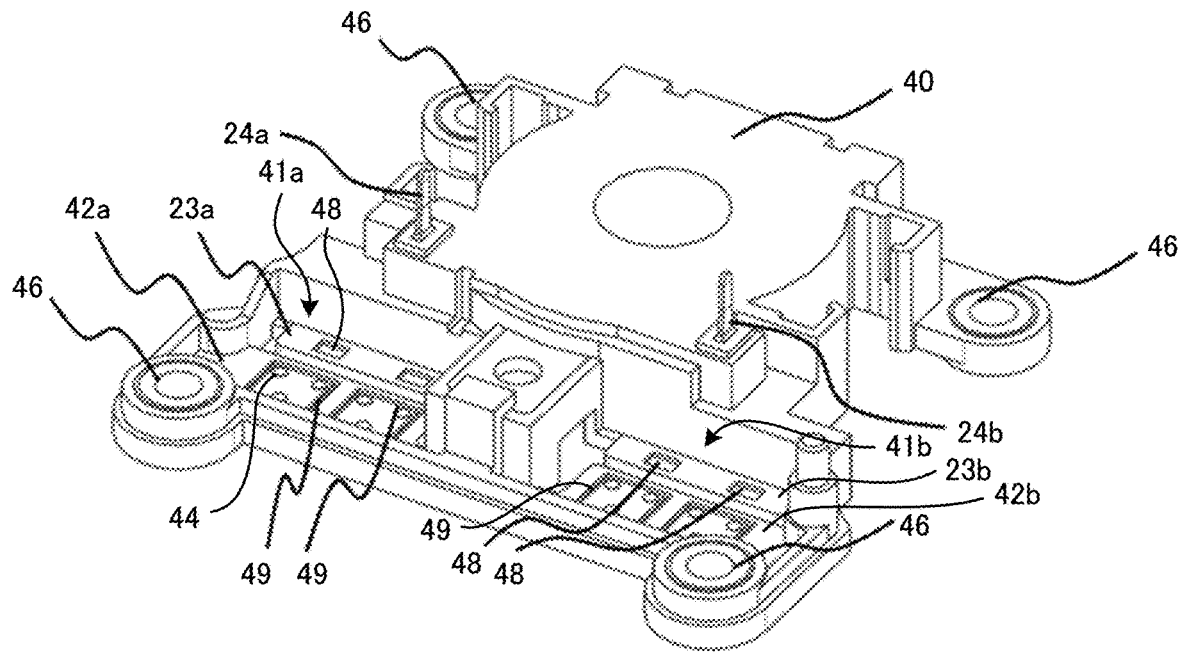
FIG. 8 is a perspective view for illustrating a configuration of a main part of a step-down converter according to a third embodiment of this disclosure.
Figure 9:
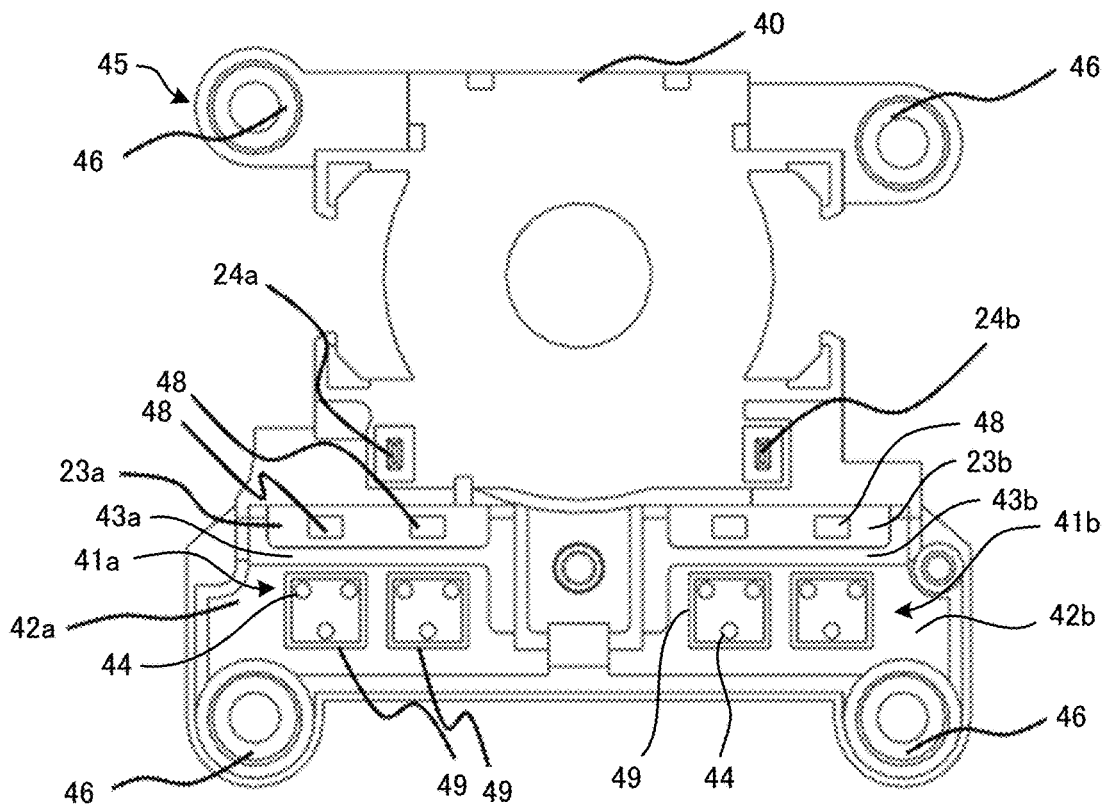
FIG. 9 is a top view for illustrating the configuration of the main part of the step-down converter according to the third embodiment.

A step-down converter according to a third embodiment of this disclosure is described. FIG. 8 is a perspective view for illustrating a configuration of a main part of the step-down converter according to the third embodiment. FIG. 9 is a top view for illustrating the configuration of the main part of the step-down converter according to the third embodiment. Components having the same functions and actions as those of the first or second embodiment are denoted by the same reference symbols, and description thereof is omitted.

As illustrated in FIG. 8 and FIG. 9, the first plate-shaped terminal 23a includes recessed portions 48. In the first plate-shaped terminal 23a, one recessed portion 48 is formed in each of a bonding surface to be bonded to the rectifier element 30a1 and a bonding surface to be bonded to the rectifier element 30a2. The first plate-shaped terminal 23b includes recessed portions 48 similarly to the first plate-shaped terminal 23a.

The second plate-shaped terminal 42a includes groove portions 49. In the second plate-shaped terminal 42a, a groove portion 49 surrounding the three protruding portions 44 is formed in the bonding surface to be bonded to the rectifier element 30a1. A similar groove portion 49 is formed also in the bonding surface to be bonded to the rectifier element 30a2. The second plate-shaped terminal 42b includes groove portions 49 similarly to the second plate-shaped terminal 42a.

In the third embodiment, the recessed portions 48 are formed in each of the first plate-shaped terminals 23a and 23b, and hence the solder melted in the reflow step can be accumulated in the recessed portions 48. In this manner, wetting and spreading of solder can be suppressed. As a result, heat sagging of solder to each of the gaps 43a and 43b can be suppressed.

Further, in the third embodiment, the groove portions 49 are formed in each of the second plate-shaped terminals 42a and 42b. Accordingly, the solder melted in the reflow step can be caused to flow into the groove portions 49, and the spread of solder over the groove portions 49 can thus be prevented. In this manner, the wetting and spreading of solder can be suppressed, and also a wetting and spreading range of solder can be managed. Thus, the heat sagging of solder to each of the gaps 43a and 43b can be suppressed.

In the third embodiment, the recessed portions 48 are formed in each of the first plate-shaped terminals 23a and 23b, but groove portions may be formed in each of the first plate-shaped terminals 23a and 23b. Further, in the third embodiment, the groove portions 49 are formed in each of the second plate-shaped terminals 42a and 42b, but recessed portions may be formed in each of the second plate-shaped terminals 42a and 42b.

A solder resist may be applied on a surface of each of the first plate-shaped terminals 23a and 23b and the second plate-shaped terminals 42a and 42b. Even when the solder resist is applied, the wetting and spreading of solder can be suppressed.

As described above, in the step-down converter according to the third embodiment, at least one of the first plate-shaped terminal 23a or the second plate-shaped terminal 42a has the recessed portion 48 or the groove portion 49 formed in the bonding surface to be bonded to the rectifier element 30a1 or 30a2. Further, at least one of the first plate-shaped terminal 23b or the second plate-shaped terminal 42b has the recessed portion 48 or the groove portion 49 formed in the bonding surface to be bonded to the rectifier element 30b1 or 30b2. With this configuration, the wetting and spreading of solder can be suppressed, and hence the heat sagging of solder to each of the gap 43a and the gap 43b can be suppressed.

Exemplary embodiments are described herein, but various features, modes, and functions described in each embodiment are applicable not only to the corresponding embodiment, but also to a different embodiment alone or in various combinations.

What is claimed is:

1. A step-down converter, comprising:
a step-down transformer including a primary-side coil and a secondary-side coil;
a resin molded body integrally molded through use of a non-conductive resin together with the primary-side coil and the secondary-side coil; and
a rectifier element configured to rectify an induced voltage of the secondary-side coil,
wherein the rectifier element is a rectifier element of a surface mount type,
wherein the resin molded body has a mounting surface on which the rectifier element is to be mounted,
wherein the secondary-side coil includes a first plate-shaped terminal,
wherein the first plate-shaped terminal is exposed from the resin molded body in the mounting surface,
wherein, on the mounting surface, a second plate-shaped terminal is provided in parallel to the first plate-shaped terminal, a gap being formed between the first plate-shaped terminal and the second plate-shaped terminal above the mounting surface,
wherein the rectifier element is bonded to both of the first plate-shaped terminal and the second plate-shaped terminal by soldering using solder,
wherein the non-conductive resin has a melting point higher than a melting point of the solder,
wherein, in the mounting surface positioned between the first plate-shaped terminal and the second plate-shaped terminal, a cavity portion is formed to penetrate through the resin molded body under the gap, a width of the cavity portion being equal to a width of the gap,
wherein the second plate-shaped terminal includes a protruding portion bonded to the rectifier element, and
wherein the second plate-shaped terminal has a groove portion formed in a bonding surface and surrounding the protruding portion.

2. The step-down converter according to claim 1, wherein the first plate-shaped terminal includes a protruding portion bonded to the rectifier element.

3. The step-down converter according to claim 1, further comprising a casing for accommodating the resin molded body,
wherein the resin molded body has a metal tubular collar portion formed thereon, and
wherein the resin molded body is fixed to the casing by a screw inserted into the metal tubular collar portion.

4. The step-down converter according to claim 1, wherein the first plate-shaped terminal has one of a recessed portion or a groove portion formed in a bonding surface to be bonded to the rectifier element.

5. The step-down converter according to claim 1, wherein the groove portion surrounds additional protruding portions on the second plate-shaped terminal and bonded to the rectifier element.

* * * * *